(12) United States Patent  
Cadloni et al.

(10) Patent No.: US 11,669,398 B2
(45) Date of Patent: Jun. 6, 2023

(54) MEMORY COMPONENTS WITH ORDERED SWEEP ERROR RECOVERY

(71) Applicant: Micron Technology, Inc., Boise, ID (US)

(72) Inventors: Gerald L. Cadloni, Longmont, CO (US); Bruce A. Liikanen, Berthoud, CO (US); Francis Chew, Boulder, CO (US); Larry J. Koudele, Erie, CO (US)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 17/135,645

(22) Filed: Dec. 28, 2020

(65) Prior Publication Data

US 2021/0117271 A1 Apr. 22, 2021

Related U.S. Application Data

(63) Continuation of application No. 16/134,899, filed on Sep. 18, 2018, now Pat. No. 10,896,092.

(51) Int. Cl.
*G06F 11/00* (2006.01)
*G06F 11/14* (2006.01)
*G06F 11/10* (2006.01)
*G11C 29/52* (2006.01)

(52) U.S. Cl.
CPC ...... *G06F 11/1402* (2013.01); *G06F 11/1068* (2013.01); *G11C 29/52* (2013.01); *G06F 2201/805* (2013.01); *G06F 2201/82* (2013.01)

(58) Field of Classification Search
CPC .................. G06F 11/1402; G06F 11/1068
See application file for complete search history.

(56) References Cited

U.S. PATENT DOCUMENTS

| | | |
|---|---|---|
| 9,092,350 B1 | 7/2015 | Jeon et al. |
| 9,397,703 B2 | 7/2016 | Ghaly et al. |
| 9,507,675 B2 | 11/2016 | Chun et al. |
| 9,619,324 B2 | 4/2017 | Kwok et al. |
| 9,910,606 B2 | 3/2018 | Khoueir et al. |
| 10,073,734 B2 | 9/2018 | Haratsch et al. |
| 10,552,259 B2 | 2/2020 | Jacobvitz et al. |
| 11,188,416 B2 * | 11/2021 | Cadloni ............... G06F 11/142 |
| 2007/0088974 A1 | 4/2007 | Chandwani et al. |
| 2015/0278015 A1 | 10/2015 | Haratsch et al. |

(Continued)

*Primary Examiner* — Amine Riad
(74) *Attorney, Agent, or Firm* — Perkins Coie LLP

(57) ABSTRACT

A memory system is disclosed, including a memory component and a processing device configured to decode one or more codewords saved to a memory region of the memory component, detect that a number of bit errors corresponding to the decoding of the codeword exceeds a correction capability of the processing device, and execute an error recovery routine to reduce the number of detected bit errors to within the correction capability. The error recovery routine can include error recovery operations that are sequentially executed either until the number of bit errors is successfully reduced to within the correction capability or until a set of the error recovery operations has been executed. The error recovery operations can be ordered according to one or more factors, including energy used to execute a respective error recovery operation, a duration of the respective operation, and/or a likelihood of success of the respective operation.

20 Claims, 7 Drawing Sheets

(56) References Cited

U.S. PATENT DOCUMENTS

| | | |
|---|---|---|
| 2018/0246794 A1 | 8/2018 | Baty et al. |
| 2019/0107973 A1 | 4/2019 | Chen |
| 2019/0286516 A1 | 9/2019 | Jacobvitz et al. |
| 2020/0089569 A1 | 3/2020 | Cadloni et al. |
| 2020/0110685 A1 | 4/2020 | Chew |

* cited by examiner

| Error Recovery Step | Error Recovery Name | Description | RR Description (Vt Offset Clicks) | Energy |
|---|---|---|---|---|
| 1 | RR0 | Read Retry 0 + Hard LDPC | RR0 = default (0) | 1 |
| 2 | RR1 | Read Retry 1 + Hard LDPC | RR1 = retention (-2) | 1 |
| 3 | RR2 | Read Retry 2 + Hard LDPC | RR2 = endurance (+2) | 1 |
| 4 | RR3 | Read Retry 3 + Hard LDPC | RR3 = retention (-5) | 1 |
| 5 | RR4 | Read Retry 4 + Hard LDPC | RR4 = ensurance (+6) | 1 |
| 6 | RR5 | Read Retry 5 + Hard LDPC | RR5 = retention (-9) | 1 |
| 7 | RR6 | Read Retry 6 + Hard LDPC | RR6 = endurance (+12) | 1 |
| 8 | RR7 | Read Retry 7 + Hard LDPC | RR7 = retention (-14) | 1 |
| 9 | RR8 | Read Retry 8 + Hard LDPC | RR8 = (RR0 + Corrective Read) | 3 |
| 10 | Soft | Read Retry 0 + Soft LDPC | RR0 + Soft LDPC | 5 |
| 11 | AutoCal + pers1 | Read Retry 0 + Auto Calibration (P1=0x03) | RR0 + Auto Calibration with persistence 1 | 6 |
| 12 | AutoCal + pers2 | Read Retry 0 + Auto Calibration (P1=0x03) | RR0 + Auto Calibration with persistence 2 | 6 |
| 13 | AutoCal + pers3 | Read Retry 0 + Auto Calibration (P1=0x03) | RR0 + Auto Calibration with persistence 3 | 6 |
| 14 | AutoCal + pers4 | Read Retry 0 + Auto Calibration (P1=0x03) | RR0 + Auto Calibration with persistence 4 | 6 |
| 15 | RR8 + pers4 | Read Retry 8 + Auto Calibration (P1=0x02) | RR8 = (RR0 + Corrective Read) with persistence 4 | 3 |
| 16 | RR0 + pers4 + Soft | Read Retry 0 + Auto Calibration (P1=0x02) + Soft LDPC | RR0 + Soft LDPC with persistence 4 | 5 |
| 17 | RR0 + RAIN | Read Retry 0 + RAIN | RR0 + RAIN | 500 |

Fig. 3A

| Error Recovery Step | Error Recovery Name | Description | RR Description (Vt Offset Clicks) | Energy |
|---|---|---|---|---|
| 1 | RR0 | Read Retry 0 + Hard LDPC | RR0 = default (0) | 1 |
| 2 | RR1 | Read Retry 1 | RR1 = endurance (+3) | 1 |
| 3 | RR2 | Read Retry 2 | RR2 = retention (-3) | 1 |
| 4 | RR3 | Read Retry 3 | RR3 = endurance (+7) | 1 |
| 5 | RR4 | Read Retry 4 | RR4 = retention (-8) | 1 |
| 6 | RR5 | Read Retry 5 | RR5 = endurance (+12) | 1 |
| 7 | RR6 | Read Retry 6 | RR6 = retention (-15) | 1 |
| 8 | RR7 | Read Retry 7 | RR7 = endurance (+18) | 1 |
| 9 | RR8 | Read Retry 8 | RR8 = (RR0 + Corrective Read) | 3 |
| 10 | RR0 + AutoCal + pers1 | Read Retry 0 + Auto Calibration (P1=0x03) | RR0 + Auto Calibration with persistence 1 | 6 |
| 11 | RR0 + AutoCal + pers2 | Read Retry 0 + Auto Calibration (P1=0x03) | RR0 + Auto Calibration with persistence 2 | 6 |
| 12 | RR0 + AutoCal + pers3 | Read Retry 0 + Auto Calibration (P1=0x03) | RR0 + Auto Calibration with persistence 3 | 6 |
| 13 | RR0 + AutoCal + pers4 | Read Retry 0 + Auto Calibration (P1=0x03) | RR0 + Auto Calibration with persistence 4 | 6 |
| 14 | RR8 + AutoCal + pers4 | Read Retry 8 + Auto Calibration (P1=0x02) | RR8 = (RR0 + Corrective Read) with persistence 4 | 3 |

Fig. 3B

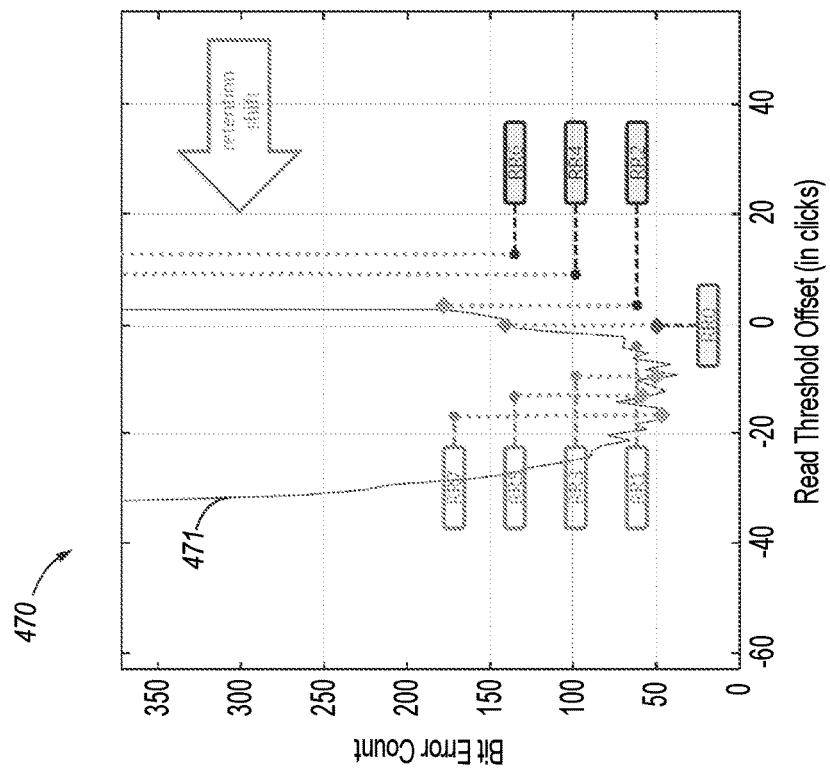
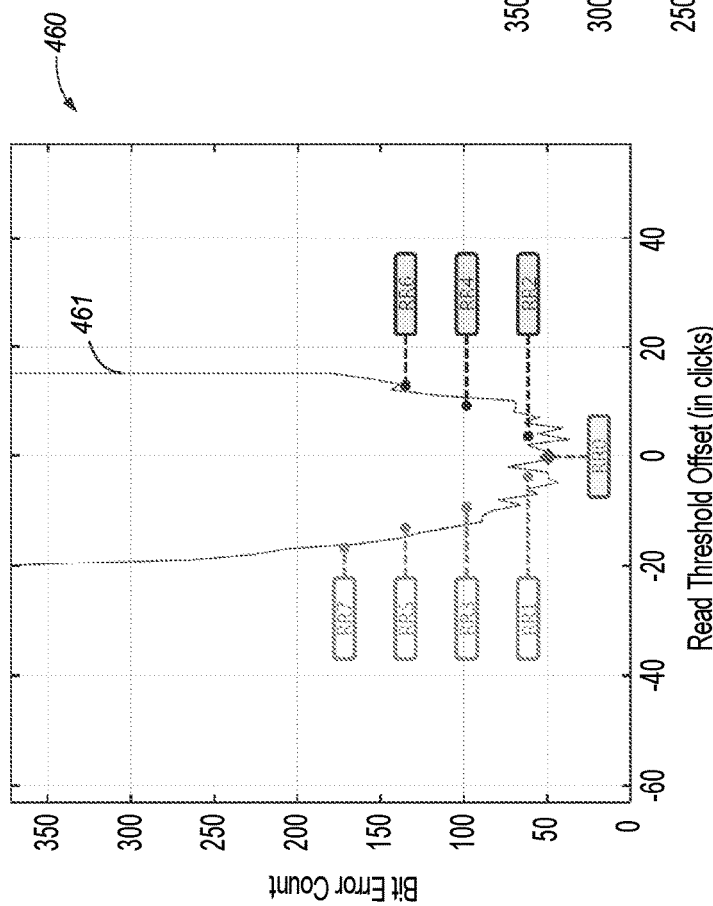
Fig. 4A
Fig. 4B

MEMORY COMPONENTS WITH ORDERED SWEEP ERROR RECOVERY

CROSS-REFERENCE TO RELATED APPLICATION(S)

This application is a continuation of U.S. application Ser. No. 16/134,899, filed Sep. 18, 2018, which is incorporated herein by reference in its entirety.

TECHNICAL FIELD

Embodiments of the disclosure relate generally to memory sub-systems, and more specifically, relate to memory sub-systems including memory components with ordered sweep error recovery.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 3A and 3B are tables illustrating error recovery error correction code (ECC) schedules of memory sub-systems configured in accordance with some embodiments of the present technology.

FIGS. 4A and 4B are plots of bit error count (BEC) versus read threshold offsets of a memory component within a memory sub-system in accordance with some embodiments of the present technology.

DETAILED DESCRIPTION

Figure 1:
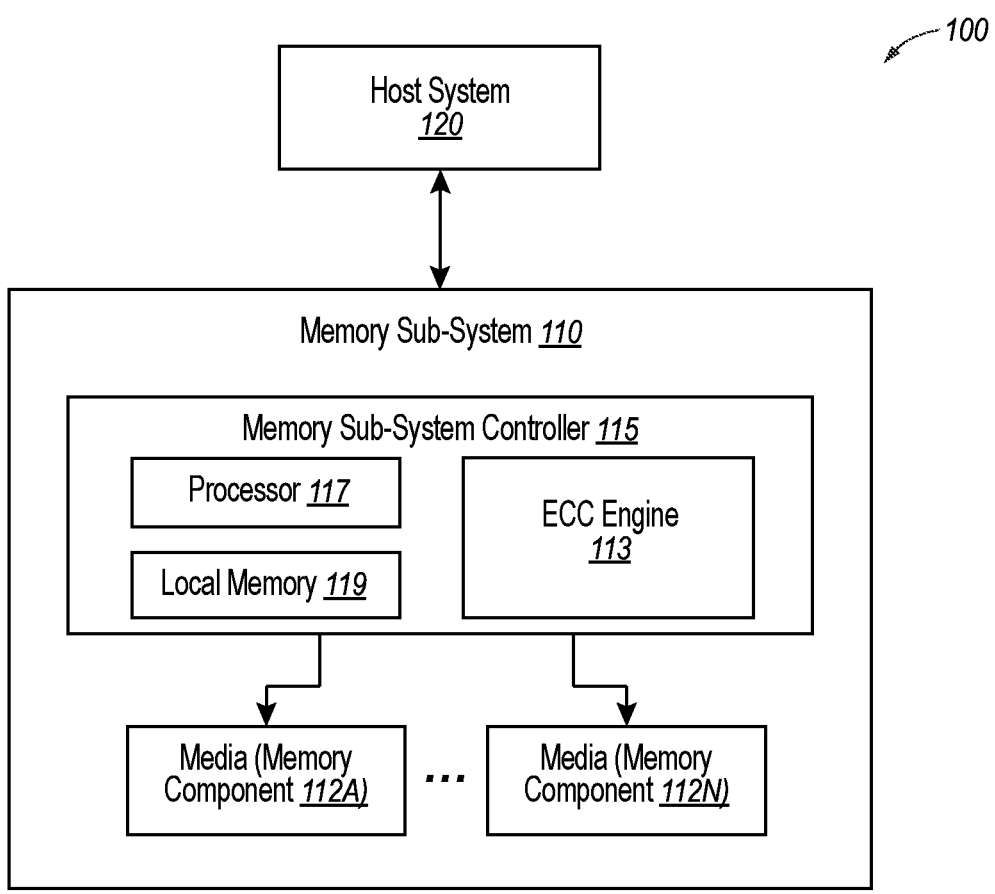
FIG. 1 illustrates an example computing environment that includes a memory sub-system in accordance with some embodiments of the present disclosure.

As discussed in greater detail below, the technology disclosed herein relates to nonvolatile memory sub-systems including memory components with ordered sweep error recovery. "Sweep error recovery" hereinafter describes executing one or more error recovery error code correction (ECC) operations on each side of a memory page's read threshold. For example, a memory sub-system can execute a first read retry error recovery ECC operation having a read offset on one side of a memory page's read threshold to clear a codeword saved to the memory page. If the first read retry error recovery ECC operation does not clear the codeword, the memory sub-system can execute a second read retry error recovery ECC operation having the same or a different (e.g., a greater) read offset on the other side of the memory page's read threshold. In this manner, the memory sub-system can reread the memory page while sweeping back and forth across the read threshold of the memory page with various (e.g., increasing) read offsets to account for retention issues, endurance issues, miscalibration of the read threshold in either direction, and/or other undesirable behavior event types of the memory sub-system.

A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Memory sub-systems are frequently provided with mechanisms that can detect and correct a certain number of errors in the data stored in memory components. For example, error correction code (ECC) encodes data in such a way that errors in the data can be identified and corrected when the data is decoded. Data strings can be encoded by an ECC encoder by adding a number of redundant and/or parity bits to create corresponding codewords. When an original data string is to be retrieved from the memory component, an ECC decoder can use the corresponding codewords to identify bit errors in the encoded data string.

NAND-based storage media often experience undesirable behaviors that frequently result in bit errors in the encoded data strings. The undesirable behaviors stem from limitations in manufacturing and varying operational conditions. Examples of these undesirable behaviors include retention-related charge loss, endurance-related charge leakage, read-related disturbances, temperature-related voltage shifts, transient voltage (first page read) behaviors, partial block misbehavior, and the like. Retention issues occur when a memory region loses charge such that its read threshold voltage shifts lower. Endurance issues occur when additional charge is injected into the memory region such that the read threshold voltage shifts higher. When a NAND-based storage media experiences a combination of one or more of these errors, it can be difficult to correctly predict, diagnose, and/or address the errors these undesirable behaviors can cause.

If bit errors are present in an encoded data string, normal ECC decode processing of an ECC decoder in an ECC engine can be employed to correct the bit errors and to clear the encoded data string. If, however, the number of bit errors present in an encoded data string exceeds the error correction capability (e.g., 80 bit errors) of the normal ECC decode processing, the normal ECC decode processing will not be sufficient to clear the encoded data string. In this event, an error recovery procedure can be employed to reduce the number of bit errors in the encoded data string to within the error correction capability of the normal ECC decode processing (e.g., 80 bit errors or less) such that the ECC engine can correct the remaining bit errors and clear the original data string.

In conventional memory devices having NAND-based storage media, there are often several error recovery procedures, each designed to address a particular one of the number of different kinds of undesirable behaviors. Thus, when a conventional memory device detects bit errors exceeding the error correction capability of the normal ECC decode processing, the conventional memory device employs an error recovery procedure (e.g., a retention error recovery procedure) designed to address a retention-related error event even though the detected bit errors may be the result of a combination of one or more of undesirable NAND behaviors (e.g., both retention-related charge loss and temperature-related voltage shifts causing an increase in read threshold voltage). In other words, the conventional memory device (i) utilizes processing resources (e.g., energy and/or time) to diagnose each error event and (ii) employs an independent error recovery procedure for each diagnosed error event that is designed to address the specific type of undesirable behavior. Furthermore, if the (e.g., retention) error recovery procedure successfully addresses the detected bit errors, the conventional memory device will employ the same (e.g., retention) error recovery procedure the next time it diagnoses the same event type (i.e., the conventional memory device employs a last recovery, first heuristic approach to error recovery). That is, conventional memory devices assume that a memory region exhibiting a diagnosed type of undesirable behavior (e.g., a cross-temperature related threshold voltage shift mis-diagnosed as an endurance-related threshold voltage shift) is more likely to exhibit the same type of error event in the future, even though many types of error events (e.g., temperature-related errors) are transient.

Aspects of the present disclosure address the above and other deficiencies by providing a memory sub-system with memory components that employ a single error recovery schedule. As described in greater detail below, because memory devices configured in accordance with embodiments of the present technology employ a single error recovery schedule, the memory devices obviate the convention to diagnose a type of error event before executing an error recovery routine. This decreases decision-making burdens on the firmware of the memory devices during the error recovery routine (thereby conserving processing resources) and improves the speed of the error recovery routine. Furthermore, error recovery operations in the error recovery schedule can be ordered such that the error recovery schedule accounts for each type of undesirable behavior. Thus, the memory devices can address and correct multiple error event types (e.g., caused by various combinations of different undesirable behaviors) in a single iteration of the error recovery routine. Moreover, by configuring a memory device to execute error recovery operations in a particular order, an error recovery operation that successfully corrects bit errors in a codeword such that the codeword can be cleared can provide an indication of the health and/or quality of a memory region corresponding to where the codeword was saved. For example, by configuring a memory device to first perform a set of one or more error recovery operations that correct a majority of bit errors that occur as a result of normal and/or expected operation of the memory device, execution of an error recovery operation outside of this set on a codeword can indicate that a memory region corresponding to where the codeword is saved includes one or more defects and/or is out of calibration. This information can (i) provide an early indication of potentially defective and/or poor performing memory regions in the memory device and (ii) be saved (e.g., in one or more logs) for post-processing. This information is also hereinafter referred to as "quality metrics" of (e.g., memory regions in) the memory device.

FIG. 1 illustrates an example computing environment 100 that includes a memory sub-system 110 in accordance with some embodiments of the present technology. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a solid-state drive (SSD). In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory regions (e.g., memory pages, data blocks, etc.) that can refer to a unit of the memory component used to store data. In these and other embodiments, one or more of the memory components 112A to 112N can include one or more controllers (not shown) for performing various processes, operations, logic flows, and routines that control operation of the memory components 112A to 112N.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes ECC hardware, such as an ECC engine 113, that can be configured to encode and/or decode data stored in the memory components 112A to 112N. In some embodiments, the controller 115 includes at least a portion of the ECC engine 113. For example, the controller 115 can include a processor 117 (processing device) configured to execute instructions stored in local memory 119 for performing the operations described herein. In some embodiments, the ECC engine 113 is part of one or more of the memory components 112A to 112N, the host system 120, an application, or an operating system. In some embodiments, the ECC engine 113 can be a Bose-Chaudhuri-Hocquenghem (BCH) ECC engine and/or a low-density parity check (LDPC) ECC engine. In these and other embodiments, the ECC engine 113 can be a Reed-Solomon (RS) ECC engine, a tightly-coupled memory (TCM) ECC engine, and/or another type of ECC engine. In these and still other embodiments, the memory sub-system 110 can include more than one ECC engine 113.

The ECC engine 113 can encode and/or decode data stored in the memory components 112A to 112N of the memory sub-system 110 (e.g., to detect and/or correct errors in data read out from, written to, and/or stored in the memory components 112A to 112N). If the ECC engine 113 determines that one or more bit errors are present, the ECC engine 113 can employ error correction code as part of normal ECC decode processing to correct the bit errors and to clear the encoded data string. If, however, the ECC engine 113 determines the number of bit errors present exceeds the ECC capability (e.g., 80 bit errors in a 1024 byte codeword) of the normal ECC decode processing, the ECC engine 113 can employ an error recovery routine in accordance with an single error recovery schedule to reduce the number of bit errors to within the ECC capability of the normal ECC decode processing (e.g., to 80 bit errors or less in a 1024 byte codeword) such that the ECC engine 113 can correct the remaining bit errors and recover the original data. The error recovery schedule can include one or more error recovery ECC operations ordered to (i) quickly address multiple undesirable NAND behaviors and (ii) provide an indication of whether the error(s) are a result of normal operation of the memory sub-system 110 or of a defect in one of the memory components 112A to 112N corresponding to where the data is saved. In some embodiments, the ECC engine 113 can save data generated during execution of one or more of the error recovery ECC operations for use in one or more error recovery ECC operations executed later in the error recovery schedule to improve the speed of the error recovery routine. Further details with regards to the operations of the ECC engine 113 are described below.

Figure 2:
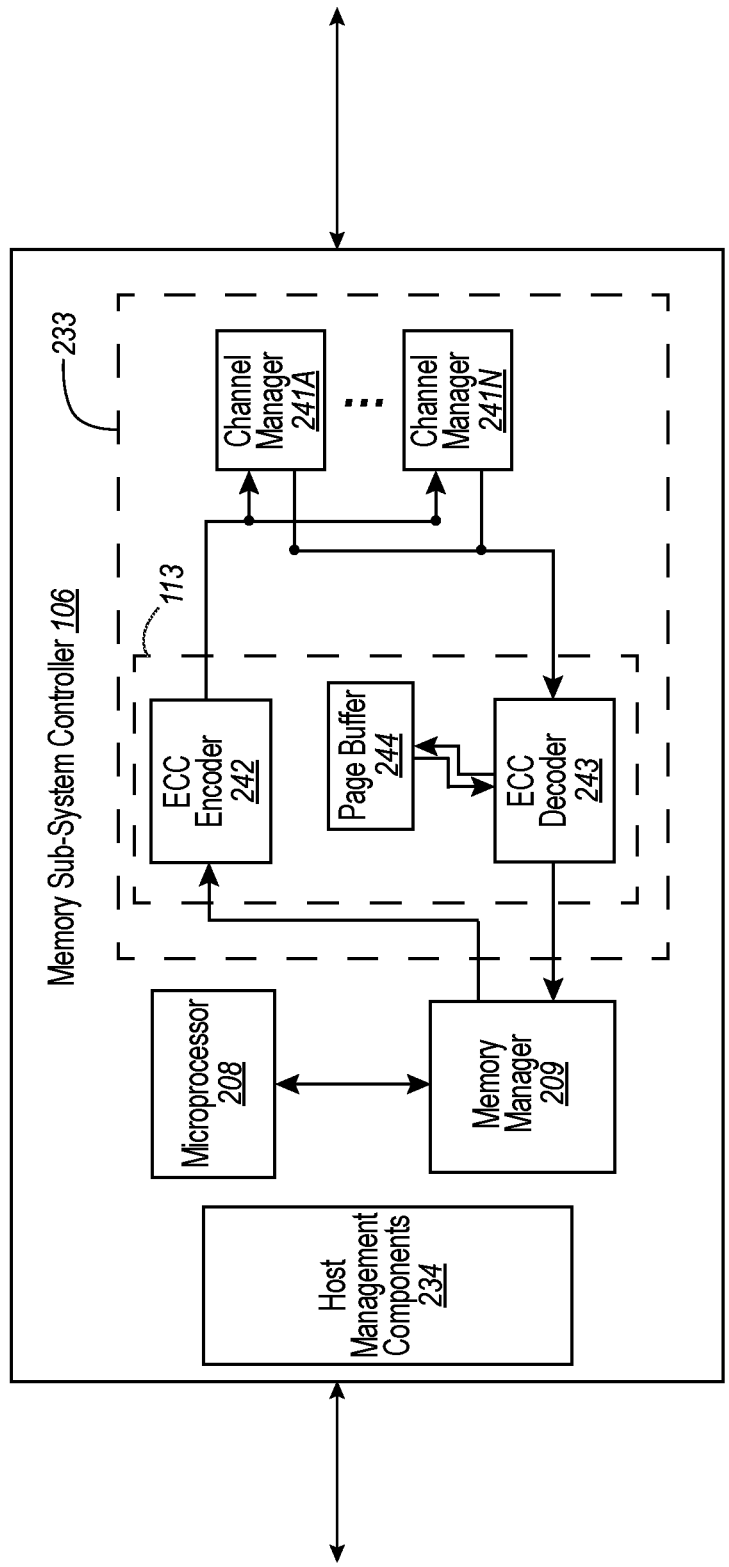
FIG. 2 illustrates a block diagram of a memory processing device having a page buffer and configured in accordance with some embodiments of the present technology.

FIG. 2 is a simplified block diagram of the controller 115 incorporating the ECC engine 113 that can be used in the memory sub-system 110 and/or in the computing environment 100. As shown, the controller 115 can include a microprocessor 208 (e.g., the processor 110; FIG. 1), a memory manager 209, host management components 234, and media management components 233. The host management components 234 are configured to manage communications between the host system 120 and the controller 115.

In the illustrated embodiment, the media management components 233 include one or more memory channel managers 241A to 241N, an ECC encoder 242, an ECC decoder 243, and a page buffer 244. In these and other embodiments, the media management components 233 can include other components (e.g., in addition to or in lieu of the page buffer 244), such as a quality metrics register, one or more buffers (e.g., a first in, first out (FIFO) circuit; a last in, first out (LIFO) circuit; etc.), and/or other registers. The memory channel manager(s) 241A to 241N are configured to communicate with the memory components 112A to 112N of a memory sub-system 110.

The page buffer 244 can be a volatile buffer configured to save, output, and/or discard data. In the illustrated embodiment, the page buffer 244 is a component of the controller 116 (e.g., of the media management components 233). In other embodiments, the page buffer 244 can be a component of other components of the memory sub-system 110 (e.g., one or more of the memory components 112A to 112N), and/or can be a component of the host system 120 and/or of the computing environment 100. In some embodiments, the memory sub-system 110 can include more than one page buffer 244. In these and other embodiments, the page buffer 244 is configured to store three pages worth of data. In other embodiments, the page buffer 244 is configured to store a different amount of data (e.g., five pages worth of data). In still other embodiments, the page buffer 244 can be configured to store a greater and/or lesser amount of data, and/or the page buffer 244 can be configured to store an amount of data dependent on a number of reliability regions the memory sub-system 110 (e.g., the ECC decoder 243) uses for ECC decode operations (e.g., for soft decode error recovery ECC operations), as described below.

The ECC encoder 242 and the ECC decoder 243 can be components of one or more ECC engines (e.g., the ECC engine 113; FIG. 1). The ECC encoder 242 and the ECC decoder 243 are configured to encode and decode, respectively, data stored in the memory components 112A to 112N of the memory sub-system 110 (e.g., to detect and/or correct errors in data read out from, written to, and/or stored in the memory components 112A to 112N). More specifically, the ECC encoder 242 is configured to encode data in accordance with one or more ECC approaches (e.g., block codes, convolution codes, and others) to create codewords. For example, the ECC encoder 242 can encode a data string by adding a number of redundant and/or parity bits to the data string. In a specific example, the ECC encoder 242 can encode a data string with k number of bits into a block with n number of bits having k-n parity bits in accordance with a block ECC. Blocks with parity bits in this example are called codewords. Codewords created by the ECC encoder 242 are written to memory regions in the memory sub-system (e.g., in one or more of the memory components 112A to 112N). In some embodiments, each memory page in the memory components 112A to 112N of the memory sub-system 110 is configured to store four codewords. In other embodiments, each memory page is configured to store 16 codewords. In still other embodiments, the number of codewords a memory page is configured to store can vary. For example, memory pages in other embodiments can be configured to store a greater (e.g., 17 or more) or lesser (e.g., 15 or less and/or three or less) number of the codewords per memory page.

When one or more codewords are read out from the memory components 112A to 112N (e.g., during an access and/or a scan operation of the memory sub-system 110), the ECC decoder 243 decodes each codeword to reconstruct the original data string(s). In some embodiments, the controller 115 can scan the memory components 112A to 112N (e.g., by die, by block, by memory page, by stripes of memory pages, etc.) to ensure data stored on the memory components 112A to 112N and/or on the local memory 119 has not and/or will not become corrupted (e.g., as part of a manufacturing and/or end-user error avoidance operation of the memory sub-system 110). The scan function can be similar to an access function of the memory sub-system 110 in that one or more codewords are read from one or more of the memory components 112A to 112N. Thus, the ECC decoder 243 is used to decode each codeword read into the controller 115 under an access operation and under a scan operation of the memory sub-system 110. The scan operation differs from the access operation, however, in that original data strings reconstructed from the codewords are not typically output to the host system 120.

The ECC decoder 243 uses the codewords (e.g., the parity bits) of each data string to provide an indication of whether there are bit errors in the data string. A bit error, or bit flip, occurs if a bit is read in a first logic state (e.g., "0") when the bit was intended to be in a second logic state (e.g., "1"). Similarly, a bit error occurs if a bit is read in the second logic state when the bit was intended to be in the first logic state. Common reasons for bit errors include writing the data string to memory at elevated temperatures and/or reading the data strings from memory in the presence of a large amount of noise. Other reasons for bit errors include defects in the memory cells of one or more of the memory components 112A to 112N storing the bits of data.

As described in greater detail below, if the ECC decoder 243 determines that one or more bit errors are present, the ECC decoder 243 can employ error correction code as part of normal ECC decode processing to correct the bit errors and to clear the codeword. If, however, the ECC decoder 243 determines the number of bit errors present exceeds the ECC capability (e.g., 80 bit errors in a 1024 byte codeword) of the normal ECC decode processing, the ECC decoder 243 can employ an error recovery routine in accordance with an single error recovery schedule to reduce the number of bit errors to within the ECC capability of the normal ECC decode processing (e.g., to 80 bit errors or less in a 1024 byte codeword) such that the ECC decoder 243 can correct the remaining bit errors and recover the original data. The error recovery schedule can include one or more ordered error recovery ECC operations. In some embodiments, the ECC decoder 243 can save data generated during one or more of the error recovery ECC operations (e.g., during one or more read retry error recovery ECC operations with varying read offsets) to the page buffer 244. The page buffer 244 can be configured to output the saved data to the ECC decoder 243 when the ECC decoder 243 performs one or more other error recovery ECC operations (e.g., error recovery ECC operations that are executed after the one or more read retry error recovery ECC operations). For example, data generated from a read retry error recovery ECC operation can be saved to the page buffer 244 and used to improve a log likelihood ratio (LLR) that is used by the ECC decoder 243 during a soft decode read retry error recovery ECC operation. Because the ECC decoder 243 is often configured to perform one or more read retry error recovery ECC operations with varying offsets as part of the soft decode read retry error recovery ECC operation, saving this data to the page buffer 244 when the memory sub-system 110 executes read retry error recovery ECC operations with varying offsets earlier in an error recovery routine can eliminate the need to perform the read retry error recovery ECC operations again when the memory sub-system 110 executes the soft decode read retry error recovery ECC operation later in the error recovery routine. As a result, the number of operations the memory sub-system 110 is configured to perform during the error recovery routine is decreased, which can improve the latency (e.g., the speed) of the error recovery routine and/or can increase the capability of the ECC decoder 243. In some embodiments, the page buffer 244 can be configured to discard the saved data (e.g., when a codeword is successfully recovered; before, during, and/or after the ECC decoder 243 executes a soft decode read retry error recovery ECC operation; etc.).

During an ECC decode operation, the ECC decoder 243 can also generate metadata regarding codewords and/or memory regions (e.g., memory dies, memory units, memory blocks, memory pages, stripes of memory pages, memory cells, etc.) of one or more of the memory components 112A to 112N where the codewords are saved. For example, the ECC decoder 243 can generate metadata including (i) a location (e.g., a memory region) in memory where a codeword is stored; (ii) whether errors are detected in the codeword, (iii) the number of bit errors present in the codeword (i.e., the number of bit errors that need to be corrected in order to clear a codeword and to recover an original data string, or a bit error count (BEC)); and/or (iv) whether bit errors have been encountered in the corresponding memory region in the past. As discussed above, if the ECC decoder 243 determines there are bit errors in a codeword and/or the number of bit errors in the codeword exceed the ECC capability of normal ECC decode processing, the ECC decoder 243 can employ one or more error recovery ECC operations to reduce the number of bit errors to within the ECC capability of the normal ECC decode processing such that the remaining bit errors can be corrected and the original data string can be recovered. As a result, the ECC decoder 243 can generate additional metadata, such as (i) error recovery ECC operations used to recover the original data string; (ii) how much energy was consumed by the error recovery ECC operations; (iii) an amount of time (e.g., processing time) required to recover the original data string; (iv) whether the codeword contained uncorrectable bit errors (e.g., a UECC event); and/or (v) whether a memory region corresponding to a memory location where the codeword was stored required a refresh and/or retirement operation. Because the metadata can provide an indication of the health or quality of memory regions storing each codeword, the metadata are frequently referred to as quality metrics of the memory regions.

In some embodiments, quality metrics can be saved to the memory sub-system 110 (e.g., in one or more of the memory components 112A to 112N, in the local memory 119, etc.). For example, a memory location (e.g., a memory channel, memory die, logical unit, physical block, physical page, and/or codeword location in the physical page) corresponding to where a codeword is stored can be saved in one or more logs. In these and other embodiments, an error recovery ECC operation used to successfully reduce the number of bit error(s) to within the ECC capability of normal ECC decode processing and/or a number of times bit errors have been encountered in the corresponding memory region in the past can be stored in the one or more logs. In these and still other embodiments, a type of corrective operation, such as a refresh operation (e.g., a garbage collection operation) and/or a retirement operation, executed on the corresponding memory region can be saved in the one or more logs. In some embodiments, the memory sub-system 110 can be configured to save one or more quality metrics to the one or more logs in response to an event (e.g., a trigger event), such as when a codeword is uncorrectable, when a codeword enters a redundant array of independent NAND (RAIN) and/or a redundant array of independent drives/disks (RAID) state, and/or when a bit error count (BEC) of a codeword is above a codeword BEC threshold.

In some embodiments, the quality metrics can be used by the controller for ECC validation and/or debugging operations. In these and other embodiments, quality metrics can be used by the controller 115, other components of the memory sub-system 110, and/or the host system 120 in several other operations of the memory sub-system 110. For example, continuous read level calibration (cRLC), dynamic program target (DPT) calibration, dynamic program step (DPS) calibration, and the like are error avoidance ECC operations that utilize quality metrics during the manufacture or operation of the memory sub-system 110 to calibrate memory regions (e.g., memory cells, memory pages, memory blocks, memory die, etc.) thereof. Additionally or alternatively, several error avoidance ECC operations of an end-user memory sub-system 110 can utilize quality metrics to operate more efficiently and/or effectively. For example, background scan, DPT for read window budge (RWB) measurements and improvements, and power loss recovery procedures each use quality metrics of the codewords as error avoidance ECC operations within an end-user memory sub-system 110. In these and other embodiments, the memory sub-system 110 can make memory (e.g., memory block) management decisions based, at least in part, on quality metrics generated and/or saved during an ECC decode operation.

FIGS. 3A and 3B are tables illustrating example error recovery schedules 330 and 340, respectively, that can be employed by the memory sub-system 110 when the memory sub-system 110 determines bit errors in a codeword exceed the ECC capability of normal ECC decode processing. As shown in FIG. 3A, the schedule 330 includes 17 error recovery ECC operations ordered (e.g., listed) in rows 301-317 of columns 331-335 in the schedule 330. These error recovery ECC operations include combinations of (i) read retries without an offset (rows 301 and 310-317), (ii) read retries with various sizes of offsets (rows 302-308), (iii) hard low-density parity checks (rows 301-309), (iv) soft low-density parity checks (rows 310 and 316), (v) corrective reads (rows 309 and 315), (vi) auto calibrations with various levels of persistence (rows 311-316), and/or (vii) RAIN recovery operations (row 317). As shown in FIG. 3B, the schedule 340 is similar to the schedule 330, except that the schedule 340 does not include soft low-density parity checks or RAIN error recovery ECC operations. Therefore, the schedule 340 includes only 14 error recovery ECC operations in total. Furthermore, the order of endurance and retention read retry error recovery ECC operations (rows 351-358) in the schedule 340 is reversed from the order of endurance and retention read retry error recovery ECC operations (rows 301-308) in the schedule 330, and the read retry error recovery ECC operations (rows 351-358) include different read offsets than the read offsets in the read retry error recovery ECC operations (rows 301-308) of the schedule 330.

Although each of the error recovery ECC operations ordered in the schedule 330 and the schedule 340 includes a combination of one or more of the ECC operations listed above in a single step, error recovery ECC operations in other embodiments can include a single ECC operation in some or all of the steps. In these and other embodiments, the memory sub-system 110 (e.g., the ECC decoder 243, the ECC engine 113, etc.) can be configured to execute different error recovery ECC operations (e.g., error recovery operations with different read offsets, RAID recovery operations, etc.) in addition to or in lieu of those ordered in the schedule 330 and/or in the schedule 340. In these and still other embodiments, the memory sub-system 110 can be configured to execute a greater or fewer number of error recovery ECC operations (e.g., before executing RAIN error recovery ECC operations) than ordered in the schedule 330 and/or in the schedule 340.

As described in greater detail below, the memory sub-system 110 can employ the schedule 330 or the schedule 340 when the memory sub-system determines bit errors in a codeword saved to a memory region of the memory sub-system 110 exceed the ECC decode capability of normal ECC decode processing. In some embodiments, the memory sub-system 110 can employ the schedule 330 or the schedule 340 depending on a memory type of the memory region. For example, the memory sub-system 110 can employ the schedule 330 if the corresponding memory region is a TLC memory region. In these and other embodiments, the memory sub-system 110 can employ the schedule 340 if the corresponding memory region is a MLC memory region. In these and still other embodiments, the memory sub-system 110 can employ only the schedule 330 or only the schedule 340 for all memory region types (e.g., SLC, MLC, TLC, etc.). In these embodiments, the memory sub-system 110 can load different read offsets into the schedule 330 or into the schedule 340 depending on the memory type of the memory region. For example, the memory sub-system 110 can load the read offsets shown in the rows 301-308 of the schedule 330 into the schedule 330 for TLC memory regions, and/or the memory sub-system 110 can load the read offsets shown in the rows 351-358 of the schedule 340 into the schedule 330 for MLC memory regions. In some embodiments, the memory sub-system 110 can preload the read offsets (e.g., for each memory type) into read threshold offset registers (not shown) in the memory sub-system 110 (e.g., on power-up of the memory sub-system 110). In these embodiments, the memory sub-system can reference the read threshold offset registers corresponding to a memory type while executing an error recovery routine, which can decrease burdens on firmware of the memory sub-system 110 (thereby conserving processing resources) and can decrease an amount of time required to execute the error recovery routine (thereby improving latency (e.g., the speed) of the routine).

Although the read retry error recovery ECC operations in rows 301-308 and 351-358 of the schedule 330 and 340, respectively, are shown in FIGS. 3A and 3B with specified read offsets, read retry error recovery ECC operations in other embodiments can have different read offsets. In some embodiments, the read offsets can be preset (e.g., during manufacture of the memory sub-system 110, for each memory type, etc.). In these and other embodiments, the read offsets can be predetermined and/or changed (e.g., as part of an error recovery routine and/or in response to a command, such as a vendor-specific (VS) command).

Referring to FIG. 3A, the column 335 of the schedule 330 lists an energy score for each error recovery ECC operation. An energy score can correspond to an amount of energy consumed by an error recovery operation. For example, the error recovery ECC operations ordered in the rows 301-308 have an energy score of one (column 335). In some embodiments, a low energy score (e.g., a value of one) indicates that the memory sub-system 110 only utilizes a small amount of energy to execute the corresponding error recovery ECC operation. In contrast, the RAIN error recovery ECC operation ordered in the row 317 of the schedule 330 has an energy score of 500. In some embodiments, a high energy score (e.g., a value of 500) indicates that the memory sub-system 110 requires a large amount (e.g., approximately 500 times that of the read retry operation) of energy to execute a corresponding error recovery ECC operation.

In some embodiments, the schedule 330 can define a particular order in which the memory sub-system 110 executes the error recovery ECC operations (as shown by columns 331 and 341 of the schedules 330 and 340, respectively). For example, the schedule 330 can order the error recovery ECC operations in accordance with their energy score. In these and other embodiments, the schedule 330 can order the error recovery ECC operations in accordance with an amount of time (e.g., processing and/or channel time) the memory sub-system 110 requires to fully execute each error recovery ECC operation and/or in accordance with a likelihood (e.g., a likelihood of success) that an error recovery ECC operation will correct bit error(s) and clear a codeword. In these and still other embodiments, the schedule 330 can order the error recovery ECC operations such that the memory sub-system 110 executes read retry error recovery ECC operations on each side of (e.g., sweeping across) a read threshold voltage of a memory region storing the codeword (e.g., to check for both endurance and retention issues), as described in greater detail below.

In some embodiments, the order of error recovery ECC operations can be predetermined and/or preset (e.g., during manufacture of the memory sub-system 110). In these and other embodiments, the order of error recovery ECC operations can be established in an end-user memory sub-system 110 (e.g., using a VS command). In these and still other embodiments, the order can be changed and/or can be dynamic. For example, the memory sub-system 110 can change the order in which the memory sub-system 110 executes the error recovery ECC operations in response to a command (e.g., a VS command). In these and other embodiments, the order can be reestablished based, at least in part, on quality metrics generated by the ECC engine 113, on a type of defect discovered in a corresponding memory region, and/or on other information.

As described in greater detail below, the memory sub-system 110 can be configured to sequentially perform the error recovery ECC operations in the schedules 330 and/or 340 starting with the first error recovery ECC operation (e.g. RR0 in the row 301 of the schedule 330) each time the memory sub-system 110 identifies bit errors in a codeword read from a memory region of the memory sub-system 110. By ordering the error recovery ECC operations in the error recovery schedule (e.g., in the schedule 330), the memory sub-system 110 (e.g., the processor 117 of the controller 115) does not need to determine a misbehavior event type or determine a next error recovery ECC operation required to correct bit errors. Thus, the error recovery schedule (e.g., the schedule 330) decreases burdens on firmware of the memory sub-system 110 when the memory sub-system 110 executes an error recovery routine by requiring less processing resources (e.g., time, energy, etc.) to execute the error recovery routine than conventional error recovery routines. In turn, latency of the error recovery routine is improved.

In the embodiments illustrated in FIGS. 3A and 3B, the error recovery ECC operations are ordered according to one or more factors. The factors can include, for example, the error recovery ECC operations in the schedule 330 are ordered in ascending cost according to a combination of their energy scores, the amounts of time required to perform the operations, and their likelihoods of success. In other words, the error recovery ECC operations are ordered in this embodiment in increasing cost and/or complexity, such that an error recovery ECC operation ordered farther down the schedule 330 has a greater likelihood of correcting bit error(s) and clearing a codeword but at a cost of more energy consumption and/or processing time.

Furthermore, the error recovery ECC operations in the schedules 330 and 340 are ordered such that the schedules 330 and 340 each include two sections: a sweep section (rows 301-308 of the schedule 330 and rows 351-358 of the schedule 340) and a defect section (rows 309-317 of the schedule 330 and rows 359-364 of the schedule 340). The sweep sections can include relatively fast and low energy error recovery ECC operations, as shown by their energy scores in columns 335 and 345. In some embodiments, these error recovery ECC operations can be configured to quickly and cheaply correct bit errors in a majority of codewords and that occur as a result of normal and expected operation of the memory sub-system 110. In contrast, the defect sections can include slower error recovery ECC operations that require a larger amount of energy but that have a higher likelihood of successfully reducing the number of bit errors in a codeword to within the ECC capability of normal ECC decode processing. In some embodiments, the memory sub-system 110 can be configured to execute the error recovery ECC operations in the sweep sections before executing error recovery ECC operations in the defect sections of the schedules 330 and 340. In these embodiments and as discussed in greater detail below, because the error recovery ECC operations in the sweep sections are designed to correct a majority of bit errors that occur as a result of normal and expected operation of the memory sub-system 110, execution of an error recovery ECC operation in the defect section of the schedule 330 and/or the defect section of the schedule 340 beyond the respective sweep sections is an indication that a memory region corresponding to where a codeword is stored is significantly out of calibration and/or includes one or more defects.

In some embodiments, error recovery ECC operations in the sweep sections are further ordered such that the memory sub-system 110 sweeps across a read threshold of a memory region with increasing read offsets such that the sweeping sections can account for multiple types of misbehavior events of the memory sub-system 110 (e.g., retention and/or endurance issues in a memory region of the memory sub-system 110). For example, FIGS. 4A and 4B are plots 460 and 470, respectively, of bit error count (BEC) versus read threshold offsets of a memory page within a memory region of the memory sub-system 110. FIG. 4A shows a read threshold centered (e.g., calibrated) to a read distribution 461 of the memory page. In this embodiment, if bit errors exceeding the ECC capability of normal ECC decode processing are discovered in a codeword stored in the memory page, the memory sub-system 110 can execute one or more error recovery ECC operations in the sweep section of an error recovery schedule (e.g., the error recovery schedule 330) to reduce the number of bit errors to within the ECC capability of the normal ECC decode processing such that the codeword can be cleared and the original data string can be recovered. In the illustrated embodiment, the memory sub-system 110 can first perform a read retry error recovery ECC operation without a read offset (e.g., RR0) in accordance with the first step of the schedule 330. This operation can account for a large presence of noise when the controller 115 originally read the codeword from the memory region, for transient voltage (first page read), and/or other misbehavior events. Because the read threshold of the memory page is centered (e.g., via continuous read level calibration (cRLC)), the RR0 operation has a high probability of correcting the bit errors and reducing the number of bit errors present in the codeword to within the ECC capability of normal ECC decode processing.

If the RR0 operation does not successfully reduce the number of bit errors in the codeword to within the ECC capability of normal ECC decode processing, the memory sub-system 110 can perform the second step in the schedule 330. The second step in the schedule 330 is a read retry error recovery ECC operation with a retention read offset of two clicks to the left (e.g., RR1). This operation can account for a retention issue in the memory page, for the read threshold of the memory page being out of calibration (e.g., being miscalibrated to the right), and/or for other misbehavior events (e.g., reading the codeword at a low temperature). As shown in FIG. 4A, the memory sub-system 110 performs the RR1 operation slightly to the left of the read threshold of the memory page. If the RR1 operation does not successfully reduce the number of bit errors in the codeword, the memory sub-system 110 can perform the third step in the schedule 330. The third step in the schedule 330 is a read retry error recovery ECC operation with an endurance read offset of two clicks to the right (e.g., RR2). This operation can account for an endurance issue in the memory page, for the read threshold of the memory page being out of calibration (e.g., being miscalibrated to the left), and/or for other misbehavior events (e.g., reading the codeword at a high temperature). If the RR2 operation does not successfully reduce the number of bit errors in the codeword, the memory sub-system 110 can perform the fourth step in the schedule 330, which is a retention read retry error recovery ECC operation with a greater retention read offset than the RR1 operation (e.g., a retention read offset of five clicks to the left). Thus, (i) endurance read retry error recovery ECC operations are interleaved between retention read retry error recovery ECC operations in the sweep section (rows 301-308) of the schedule 330 and (ii) the read retry error recovery ECC operations are executed with increasing read offsets such that the memory sub-system 110 rereads the memory page sweeping back and forth across the read threshold of the memory page with increasing width to account for retention issues, endurance issues, miscalibration in either direction, and/or other undesirable behavior event types.

FIG. 4B illustrates a read distribution 471 (e.g., the read distribution 461) corresponding to a retention shift in a memory region. The retention shift of the memory region can be caused by, for example, a retention issue in the memory region, reading codewords saved in the memory region at a low temperature, and/or a miscalibration of the read threshold of the memory region. In contrast with the read distribution 461 shown in FIG. 4A, the read distribution 471 is shifted to the left (e.g., to a lower voltage) such that the read threshold of the memory page is out of calibration to the right (e.g., set at too high a voltage). In this embodiment, if bit errors in a codeword saved to the memory region exceed the ECC capability of normal ECC decode processing, there is a small probability that the memory sub-system 110 will be able to successfully reduce the number of bit errors in the codeword to within the ECC capability of the normal ECC decode processing using the RR0 and/or RR2 error recovery ECC operations. Similarly, the memory sub-system 110 will likely be unable to successfully reduce the number of bit errors using the other endurance read retry error recovery ECC operations of the schedule 330 (e.g., RR4 and/or RR6). In contrast, the memory sub-system 110 has a high probability of successfully reducing the number of bit errors in the codeword using the RR1, RR3, RR5, and/or RR7 retention error recovery ECC operations (rows 302, 304, 306, and 308) of the schedule 330.

As discussed above and described in greater detail below, the memory sub-system 110 in some embodiments can save data generated during one or more of the error recovery ECC operations in the sweep sections of the schedule 330 and/or 340 to a page buffer 244 (FIG. 2). The page buffer 244 can output the data when the memory sub-system 110 executes an error recovery ECC operation (e.g., a soft LDPC error recovery ECC operation) in the defect section of the schedules 330 and/or 340. This can improve the latency (e.g., the speed) of the error recovery routine because the memory sub-system 110 does not need to repeat read retry error recovery ECC operations as a part of the error recovery ECC operations in the defect section of the schedules 330 and/or 340.

In contrast to the sweep sections, the defect sections of the schedule 330 and 340 include slower error recovery ECC operations that require a larger amount of energy but that have a higher likelihood of successfully reducing the number of bit errors in a codeword to within the ECC capability of normal ECC decode processing. The error recovery ECC operations in the defect sections of the schedules 330 and 340 can be executed after the error recovery ECC operations in the sweep sections and are meant to correct bit errors that cannot be corrected with the error recovery ECC operations in the sweep sections of the schedule 330 and 340. In other words, the error recovery ECC operations are ordered in the schedules 330 and 340 such that the memory sub-system 110 utilizes less energy and/or time intensive error recovery ECC operations (in the sweep sections) at a higher frequency than those error recovery ECC operations ordered later (in the defect sections), reserving higher energy and/or time intensive error recovery ECC operations for codewords having a larger number of bit errors and/or having bit errors that occur as a result of a memory region operating outside of normal and/or expected operations of the memory sub-system 110. As discussed above, because the error recovery ECC operations in the sweep sections are designed to correct a majority of bit errors that occur as a result of normal and expected operation of the memory sub-system 110, if a memory sub-system 110 is required to execute an error recovery ECC operation in the defect sections of the schedule 330 and/or the schedule 340 beyond the sweep sections, this is an indication that a memory region corresponding to where a codeword is stored is significantly out of calibration and/or includes one or more defects. Therefore, quality metrics regarding which error recovery ECC operation helped to successfully reduce the number of bit errors to within the ECC capability of normal ECC decode processing such that the codeword could be cleared (e.g., how deep into the schedule 330 a memory sub-system 110 is required to execute error recovery ECC operations before the codeword could be cleared) provides information about the health and/or quality of a corresponding memory region storing the codeword. In some embodiments, the memory sub-system 110 can save this indication to memory (e.g., in one or more logs) and/or the memory sub-system can make one or more memory management decisions based on this indication.

In this manner, memory sub-systems 110 configured in accordance with embodiments of the present technology utilize a single, non-branching error recovery routine (e.g., in accordance with the schedule 330 or the schedule 340) to attempt to reduce the number of bit errors in a codeword that occur as a result of any misbehavior event type. Ordering error recovery ECC operations to sweep across a read threshold of a memory region accounts for multiple types of issues. In addition, the use of a single error recovery routine without branches eliminates a need for the memory sub-systems 110 to determine a type of misbehavior event encountered and/or to determine which error recovery routine to apply. Furthermore, several components of the error recovery ECC operations (e.g., the read offsets) can be preloaded into registers (e.g., upon power-up of the memory sub-systems 110), which can further lighten the burden on firmware of the memory sub-systems 110 and can improve the latency of the error recovery routine. Moreover, saving data to one or more page buffers 244 (FIG. 2) while performing error recovery ECC operations in the sweep section of the error recovery schedule and outputting the data to the memory sub-systems 110 when the memory sub-systems 110 later executes error recovery ECC operations in the defect section of the error recovery schedule can further improve the latency of the error recovery routine. Additionally, by ordering the error recovery ECC operations into a sweep section and a defect section and by ordering error recovery ECC operations in increasing energy and/or time cost with increasing likelihoods of success, the error recovery routine can provide an indication of the health and/or quality of a memory region storing one or more codewords having bit errors.

Figure 5:
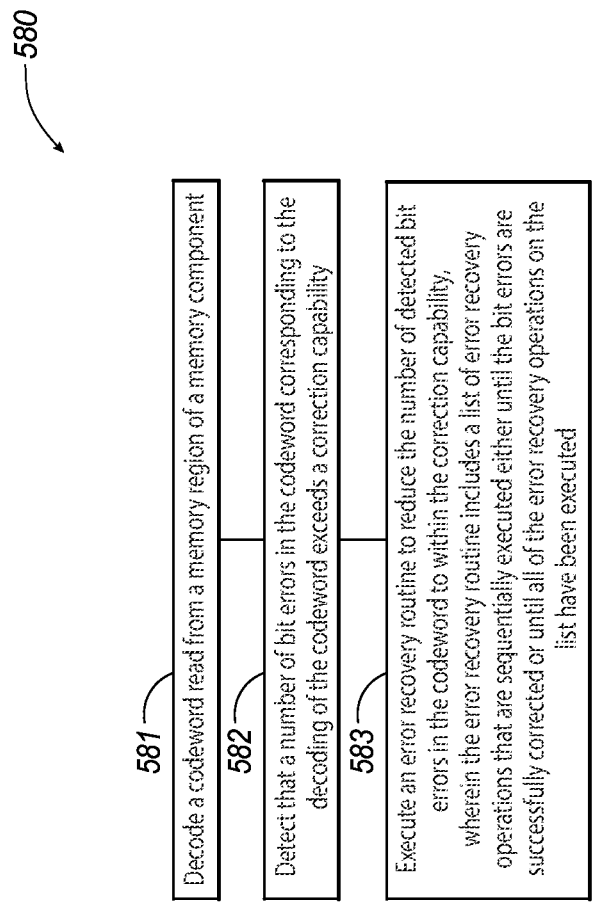
FIG. 5 is a flow diagram illustrating an example error recovery method in accordance with some embodiments of the present technology.

FIG. 5 is a flow diagram of an example error recovery method 580 in accordance with some embodiments of the present disclosure. The method 580 can be performed, at least in part, by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 580 is performed by components of the memory sub-system 110 (e.g., by the memory sub-system controller 115, the processor 117, the ECC engine 113, the encoder 242, the decoder 243, the page buffer 244, the local memory 119, and/or one or more of the memory components 112A to 112N). In these and other embodiments, all or a subset of the steps of the method 580 can be performed by other components of the memory sub-system 110, by components of a host system 120, and/or by other components of the computing environment 100. Although shown in a particular sequence or order, unless otherwise specified, the order of the processes can be modified. Thus, the illustrated embodiment should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 581, the method 580 can decode a codeword read from a memory region of a memory component. For example, the method 580 can decode a codeword from a memory page, a memory block, a memory die, etc. in the memory sub-system 110 (e.g., in one or more of the memory components 112A to 112N, in the local memory 119, etc.). In these and other embodiments, the method 580 can decode the codeword to reconstruct a corresponding original data string as part of an access operation. In these and still other embodiments, the method 580 can decode the codeword as part of a scan operation (e.g., executed to ensure data stored on the memory components 112A to 112N and/or on the local memory 119 has not and/or will not become corrupted).

At block 582, the method 580 can detect that a number of bit errors in the codeword corresponding to the decoding of the codeword exceeds a correction capability of the ECC engine 113 corresponding to the decoding of the codeword. For example, one or more undesirable behaviors of the memory components (e.g., endurance issues, retention issues, temperature issues) can cause bit errors in the original data string (e.g., as it is encoded and saved to the memory components) and/or in the corresponding codeword (e.g., as the codeword is read from the memory components). In these embodiments, the method 580 can detect (e.g., using parity bits of the codeword) whether one or more bit errors beyond the correction capability of normal ECC decode processing of the ECC engine 113 are present in the codeword.

At block 583, the method 580 can execute an error recovery routine to reduce the number of detected bit errors in the codeword to within the correction capability of the ECC engine 113. In some embodiments, the method 580 can automatically execute the error recovery routine when the method 580 detects one or more bit errors beyond the correction capability of the ECC engine 113 at block 582. In other embodiments, the method 580 can execute the error recovery routine in response to a command (e.g., a VS command).

In these and other embodiments, the method 580 can load an error recovery schedule (e.g., the schedule 330 or the schedule 340) before executing the error recovery routine. For example, the method 580 can determine a memory type (e.g., SLC, MLC, TLC) of the memory region and can load an error recovery schedule corresponding to the memory type. In these and still other embodiments, the method 580 can load read offsets corresponding to the memory type into an error recovery schedule. In still other embodiments, the method 580 can preload read offsets for each memory type into read threshold offset registers (e.g., upon power-up of the memory sub-system 110) and/or can later reference the read offsets in the read threshold offset registers corresponding to the memory type while executing one or more error recovery ECC operations, as described in greater detail below.

In some embodiments, the error recovery routine can include an ordered plurality of error recovery operations that can be sequentially executed either until the number of bit errors in the codeword is successfully reduced to within the correction capability of the ECC engine 113 or until a (e.g., predetermined) set (e.g., all) of the error recovery operations in the ordered plurality of error recovery operations have been executed. In these and other embodiments, the method 580 can order the error recovery ECC operations according to one or more factors as discussed above (e.g., according to an energy score, processing time, and/or a likelihood of success of each error recovery ECC operation). In these and still other embodiments, the method 580 can order the error recovery ECC operations into a sweep section and a defect section and/or can order the error recovery ECC operations such that the method 580 executes error recovery ECC operations in the sweep section of the schedule 330 before executing error recovery ECC operations in the defect section of the schedule.

Using the error recovery schedule 330 illustrated in FIG. 3A as an example, the method 580 in some embodiments can execute a first error recovery ECC operation (e.g., RR0 in the row 301) in the order of error recovery operations included in the error recovery schedule 330. The method 580 can determine whether the first error recovery ECC operation successfully reduced the number of bit errors in the codeword wo within the correction capability of the ECC engine 113 such that the codeword could be cleared. If the method 580 determines that the first error recovery ECC operation successfully reduced the number of bit errors such that the codeword could be cleared, the method 580 can terminate the error recovery routine such that it does not perform a next error recovery ECC operation (e.g., RR1 in the row 302) in the schedule 330. In some embodiments and/or in accordance with some operations (e.g., an access operation) of the memory sub-system 110, the method 580 can output an original, decoded data string corresponding to the corrected codeword (e.g., to the host system 120).

On the other hand, if the method 580 determines that the first error recovery ECC operation (e.g., RR0) did not successfully reduce the number of bit errors such that the codeword could be cleared, the method 580 can save data generated by the first error recovery operation (e.g., RR0) to a page buffer. For example, the method 580 can save data generated by the first error recovery ECC operation (e.g., RR0) to one or more page buffers (e.g., the page buffer 244). As discussed above, some error recovery ECC operations require execution of one or more other error recovery ECC operations as part of their operations. For example, soft low-density parity check error recovery ECC operations (e.g., RR0+Soft and RR0+pers4+Soft in rows 310 and 316 of the schedule 330) require one or more read retry error recovery ECC operations with varying read offsets (e.g., RR0-RR7 in rows 301-308 of the schedule) as part of their operations. Thus, the method 580 can save data generated during the one or more other error recovery ECC operations (e.g., during the RR0-RR7 operations) executed earlier in the order of error recovery operations to one or more page buffers 244 such that the method 580 can reference and use the generated data when it later executes other error recovery ECC operations (e.g., the RR0+Soft and RR0+pers4+Soft operations, operations in the defect section of the schedule 330, other read retry error recovery ECC operations, etc.).

Additionally or alternatively, the method 580 can execute a second error recovery ECC operation (e.g., RR1) in the error recovery schedule 330. The method 580 can proceed to determine whether the second error recovery ECC operation in the error recovery schedule successfully reduced the number of bit errors in the codeword to within the correction capability of the ECC engine 113. If the method 580 determines that the second error recovery ECC operation successfully reduced the number of bit errors in the codeword such that the codeword could be cleared, the method 580 can terminate the error recovery routine such that it does not perform a next error recovery ECC operation (e.g., RR2 in the row 303) in the schedule 330. In some embodiments and/or in accordance with some operations (e.g., an access operation) of the memory sub-system 110, the method 580 can output an original, decoded data string corresponding to the corrected codeword (e.g., to the host system 120). In these and other embodiments, the method 580 can discard data generated during executed error recovery ECC operations and/or saved to the page buffer(s) 244.

On the other hand, if the method 580 determines that the second error recovery ECC operation (e.g., RR1) did not successfully reduce the number of bit errors in the codeword, the method 580 can save data generated during execution of the second error recovery ECC operation (e.g., to the page buffer(s) 244) and/or can execute a next error recovery ECC operation (e.g., RR3) in the order of error recovery operations established by the schedule 330. The method 580 can proceed in this order until the bit errors are reduced to within the correction capability of the ECC engine 113 and the codeword is cleared and/or until the method 580 executes an error recovery operation that incorporates an earlier executed error recovery ECC operation.

When the method 580 executes a later executed error recovery ECC operation that incorporates an earlier executed error recovery ECC operation, the method 580 can access data saved to the one or more page buffers 244 such that the method 580 is not required to execute the earlier executed error recovery ECC operation again when executing the later executed error recovery ECC operation. For example, a soft low-density parity check error recovery ECC operation requires one or more read retry error recovery ECC operations with varying offsets to improve quality of a log likelihood ratio (LLR). Thus, if the method 580 previously executed one or more read retry error recovery ECC operations with varying offsets and saved the data generated during these read retry operations, the method 580 can access the saved data instead of re-executing the read retry operations and use it when the method 580 executes the soft low-density parity check operation. This decreases the number of operations the method 580 is required to perform, which, in turn, improves the speed of the method 580 (e.g., of the error recovery routine).

The method 580 can proceed to determine whether the later executed error recovery ECC operation in the error recovery schedule 330 successfully reduced the number of bit errors in the codeword to within the correction capability of the ECC engine 113 such that the codeword could be cleared. If the method 580 determines that the later executed error recovery ECC operation successfully reduced the number of bit errors such that the codeword could be cleared, the method 580 can terminate the error recovery routine such that it does not perform a next error recovery ECC operation in the schedule 330. In some embodiments and/or in accordance with some operations (e.g., an access operation) of the memory sub-system 110, the method 580 can output an original, decoded data string corresponding to the corrected codeword (e.g., to the host system 120). In these and other embodiments, the method 580 can discard data generated during executed error recovery ECC operations, saved to the page buffer(s) 244, and/or accessed from the page buffer(s) 244. On the other hand, if the method 580 determines that the later executed error recovery ECC operation did not successfully reduce the number of bit errors in the codeword to within the correction capability of the ECC engine 113, the method 580 can proceed to save data generated during the later executed error recovery ECC operation to the page buffer(s) 244 and/or to execute a next error recovery ECC operation in the order established by the schedule 330. The method 580 can proceed in this order until the bit errors are reduced to within the correction capability of the ECC engine 113 and the codeword is cleared and/or until the method 580 executes a last error recovery ECC operation in the order established by the schedule 330.

When the method 580 executes the last error recovery ECC operation in the error recovery schedule 330, the method 580 can determine whether the last error recovery ECC operation in the schedule successfully reduced the number of bit errors in the codeword to within the correction capability of the ECC engine such that the codeword could be cleared. In some embodiments, if the last error recovery ECC operations in the schedule 330 does not successfully reduce the number of bit errors in the codeword, the method 580 can classify the codeword as uncorrectable (e.g., UECC) and terminate the error recovery routine. On the other hand, if the method 580 determines that the last error recovery ECC operation successfully reduced the number of bit errors in the codeword to within the correction capability of the ECC engine 113 such that the codeword could be cleared, the method 580 can terminate the error recovery routine.

As discussed above, when the method 580 terminates the error recovery routine, the method 580 can discard data generated during execution of one or more error recovery ECC operation in the error recovery schedule 330 and/or saved to and/or accessed from the page buffer(s) 244. In other embodiments, the method 580 can (e.g., permanently) save the data to non-volatile memory in the memory sub-system 110 (e.g., for post-processing). In these and other embodiments, the method 580 can save (e.g., in one or more logs) one or more quality metrics generated during the method 580 to memory (e.g., for post-processing). For example, the method 580 can save (i) a location in memory of a codeword on which the method 580 executed an error recovery ECC operation a certain depth (e.g., beyond the sweep section) in the order established by the error recovery schedule 330, (ii) an indication of an error recovery ECC operation that successfully reduced the number of bit errors in the codeword to within the correction capability of the ECC engine 113 such that the codeword could be cleared, and/or (iii) whether the method 580 classified the codeword as uncorrectable. In some embodiments, the method 580 can schedule and/or perform corrective operations (e.g., refresh and/or retirement operations) on the corresponding memory region based, at least in part, on the quality metrics. In these and still other embodiments, the method 580 can output (e.g., to a host system 120) original data strings corresponding to a successfully decoded codeword (e.g., during an access operation of the memory sub-system 110) or an indication that an original data string corresponding to an uncorrectable codeword is corrupted and/or is unrecoverable.

Figure 6:
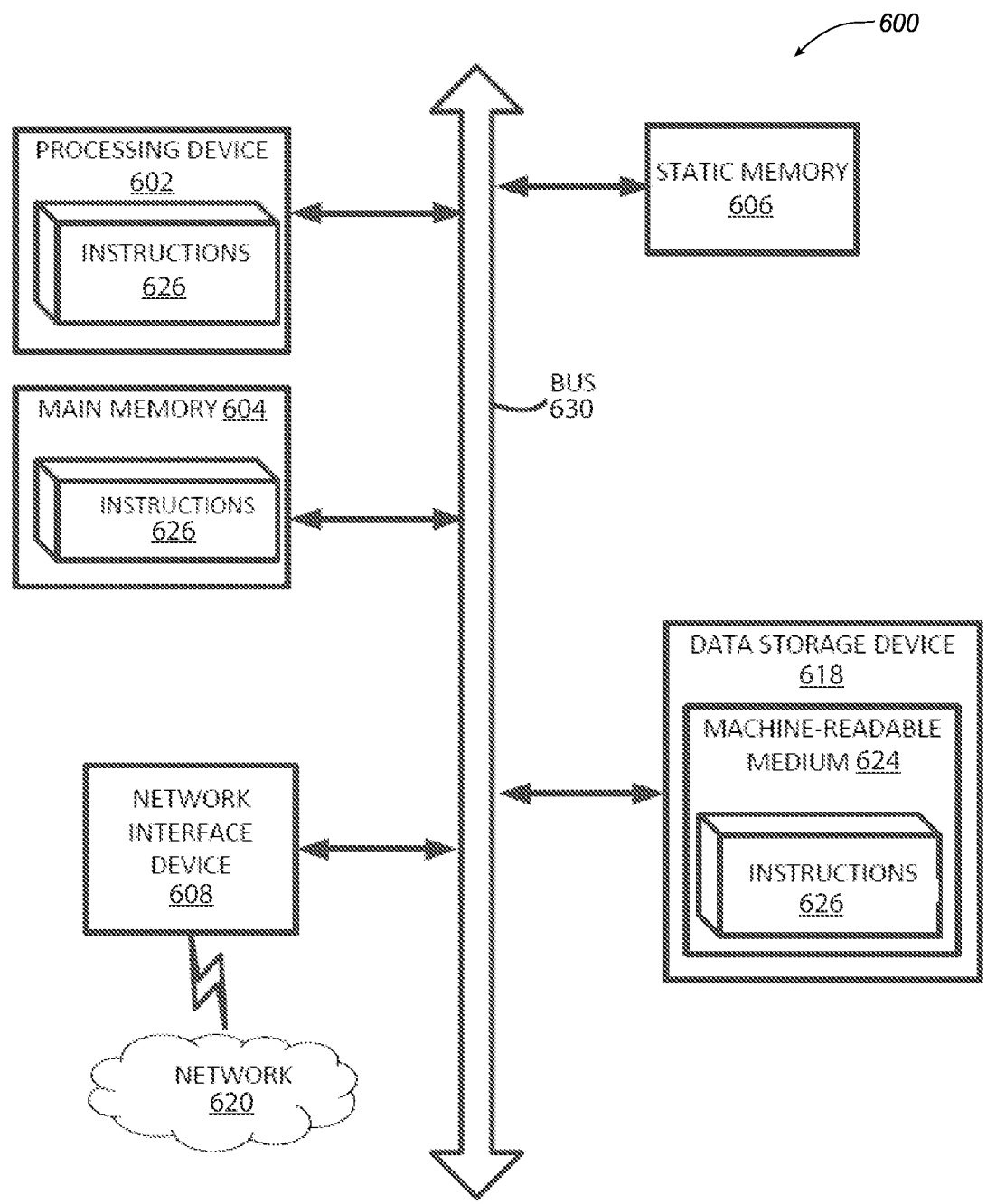
FIG. 6 is a block diagram of an example computer system in which implementations of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the processor 110, the ECC engine 113, and/or the local memory 119 of FIG. 1 and/or the microprocessor 208, the memory manager 209, the ECC encoder 242, the ECC decoder 243, and/or the page buffer 244 of FIG. 2). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to employing a single error recovery schedule and/or saving and/or accessing data generated during one or more of the error recovery ECC operations (e.g., the processor 110, the ECC engine 113, and/or the local memory 119 of FIG. 1 and/or the microprocessor 208, the memory manager 209, the ECC encoder 242, the ECC decoder 243, and/or the page buffer 244 of FIG. 2). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

We claim:

1. A system, comprising:
   a memory component including a memory region having
     a read threshold; and a processing device operably connected to the memory component, wherein:

the processing device is configured to execute a first error recovery operation having a first read offset on a first side of the read threshold and a second error recovery operation immediately following the first error recovery operation, and the second error recovery operation has a second read offset on a second side of the read threshold opposite the first side.

2. The system of claim 1, wherein the first read offset has a first magnitude and the second read offset has a second magnitude that is equal to or greater than the first magnitude.

3. The system of claim 1, wherein:

the processing device is configured to execute a third error recovery operation immediately following the second error recovery operation; and the third error recovery operation has a third read offset on the first side of the read threshold.

4. The system of claim 3, wherein the first read offset has a first magnitude and the third read offset has a second magnitude greater than the first magnitude.

5. The system of claim 1, wherein:

the processing device is configured to execute a third error recovery operation immediately preceding the first error recovery operation; and the third error recovery operation does not include a read offset.

6. The system of claim 1, wherein:

the processing device is configured to execute an error recovery routine according to an error recovery schedule having an ordered plurality of error recovery operations that includes the first error recovery operation and the second error recovery operation;

the processing device is further configured to determine a memory type of the memory region; and the ordered plurality of error recovery operations corresponds to the determined memory type of the memory region.

7. The system of claim 1, wherein the processing device is further configured to determine a memory type of the memory region, and wherein the first read offset and/or the second read offset are dependent upon the memory type of the memory region.

8. The system of claim 1 further comprising one or more read threshold offset registers, wherein the processing device is further configured to preload the first read offset and/or the second read offset into the one or more read threshold offset registers upon power-up of the memory system.

9. The system of claim 1, wherein:

the processing device is configured to execute an error recovery routine according to an error recovery schedule having an ordered plurality of error recovery operations that includes the first error recovery operation and the second error recovery operation;

the ordered plurality of error recovery operations is a first ordered plurality of error recovery operation; and the processing device is further configured to reorder the plurality of error recovery operations in the first ordered plurality of error recovery operations to a second ordered plurality of error recovery operations.

10. The system of claim 9, wherein:

the processing device is configured to reorder the plurality of error recovery operations in response to a command; and/or the processing device is configured to reorder the plurality of error recovery operations based, at least in part, (i) on quality metrics generated by an error code correction (ECC) decoder and/or (ii) on a type of defect discovered in the memory region.

11. The system of claim 1, wherein:

the processing device is configured to execute an error recovery routine according to an error recovery schedule having an ordered plurality of error recovery operations that includes the first error recovery operation and the second error recovery operation;

error recovery operations in the ordered plurality of error recovery operations are ordered into a sweep section and a defect section;

the first error recovery operation and the second error recovery operation are included in the sweep section;

error recovery operations included in the defect section are ordered according to one or more factors; and the one or more factors include (i) an energy use factor representing energy used to execute a respective error recovery operation, (ii) a duration factor representing a duration of time required to execute the respective error recovery operation, and/or (iii) a likelihood of success factor representing a likelihood of the respective error recovery operation successfully reducing the number of bit errors identified in the codeword.

12. The system of claim 11, wherein the error recovery operations included in the defect section each has a relatively higher energy use factor, duration factor, and/or likelihood of success factor than a respective energy use factor, duration factor, and/or likelihood of success factor of any of the error recovery operations included in the sweep section.

13. The system of claim 1, wherein:

the processing device is configured to execute an error recovery routine according to an error recovery schedule having an ordered plurality of error recovery operations that includes the first error recovery operation and the second error recovery operation;

the system further comprises one or more page buffers;

the processing device is further configured to:

save data generated from execution of one or more error recovery operations in the ordered plurality of error recovery operations to the one or more page buffers; and access the saved data from the one or more page buffers to execute an additional error recovery operation in the ordered plurality of error recovery operations after the execution of the one or more error recovery operations.

14. A method, comprising:

executing (a) a first error recovery operation having a first read offset on a first side of a read threshold of a memory region and (b) a second error recovery operation immediately following the first error recovery operation, wherein the second error recovery operation has a second read offset on a second side of the read threshold opposite the first side.

15. The method of claim 14, wherein:

the method further comprises executing a third error recovery operation immediately following the second error recovery operation;

the third error recovery operation has a third read offset on the first side of the read threshold; and the third read offset has a magnitude greater than a magnitude of the first read offset.

16. The method of claim 14, wherein:

the method further comprises executing a third error recovery operation immediately preceding the first error recovery operation; and the third error recovery operation does not include a read offset.

17. The method of claim 14, wherein:

the method comprises determining a memory type of the memory region, and executing an error recovery routine according to an error recovery schedule having an ordered plurality of error recovery operations;

executing the error recovery routine includes the executing of the first error recovery operation and the executing of the second error recovery operation;

the ordered plurality of error recovery operations includes the first error recovery operation and the second error recovery operation; and the ordered plurality of error recovery operations corresponds to the determined memory type of the memory region, or the first read offset and/or the second read offset are dependent upon the memory type of the memory region.

18. The method of claim 14 further comprising preloading the first read offset and/or the second read offset into the one or more read threshold offset registers upon power-up of the memory component.

19. The method of claim 14, wherein:

the method comprises executing an error recovery routine according to an error recovery schedule having an ordered plurality of error recovery operations;

executing the error recovery routine includes the executing of the first error recovery operation and the executing of the second error recovery operation;

the ordered plurality of error recovery operations includes the first error recovery operation and the second error recovery operation; and the method further comprises reordering the plurality of error recovery operations of the ordered plurality of error recovery operations.

20. A non-transitory computer-readable storage medium comprising instructions that, when executed by a processing device, cause the processing device to:

execute (a) a first error recovery operation having a first read offset on a first side of a read threshold of a memory region and (b) a second error recovery operation immediately following the first error recovery operation, wherein the second error recovery operation has a second read offset on a second side of the read threshold opposite the first side.

* * * * *